United States Patent [19]

Thornton

[11] 4,160,216
[45] Jul. 3, 1979

[54] APPARATUS FOR ELIMINATING ON-OFF TRANSITIONAL GAIN VARIATIONS IN CLASS AB, B AND C ACTIVE ELEMENT AMPLIFIERS

[76] Inventor: Barry W. Thornton, 2340 Selma St., Sacramento, Calif. 95815

[21] Appl. No.: 870,011

[22] Filed: Jan. 16, 1978

[51] Int. Cl.² .............................................. H03F 3/26
[52] U.S. Cl. .................................... 330/267; 330/263; 330/273; 330/296
[58] Field of Search ............... 330/262, 263, 273, 267, 330/268, 296, 261

[56] References Cited

U.S. PATENT DOCUMENTS

| 3,995,228 | 11/1976 | Pass | 330/268 X |
| 4,051,433 | 9/1977 | Seki et al. | 330/261 X |

*Primary Examiner*—Lawrence J. Dahl
*Attorney, Agent, or Firm*—Lane, Aitken & Ziems

[57] ABSTRACT

A high fidelity audio amplifier having a pair of cooperating active amplifying devices includes two diodes, each of which is connected in a distinct signal pathway directly associated with an active amplifying device so that the amplifier achieves true Class A operation over the full range of normal input signals. The amplifier can achieve true Class A operation using bipolar transistors, field effect transistors, or vacuum tubes as the active amplifying devices.

18 Claims, 22 Drawing Figures

APPARATUS FOR ELIMINATING ON-OFF TRANSITIONAL GAIN VARIATIONS IN CLASS AB, B AND C ACTIVE ELEMENT AMPLIFIERS

BACKGROUND OF THE INVENTION

This invention relates to high fidelity audio amplifiers, particularly power amplifiers, and still more particularly, to means for minimizing or eliminating discontinuities and transitional gain variations in such amplifiers such as occur when the active amplifying devices are successively driven between their conductive and non-conductive states. Although useful overall signal amplification can be achieved, such discontinuities and transitional gain variations prevent the attainment of true high fidelity audio amplification and produce cross-over distortion. These problems commonly occur with active amplifying devices such as bipolar transistors, field effect transistors, and vacuum tubes.

A high fidelity audio amplifier operating as a Class A type amplifier does not experience these problems because the active amplifying devices in such amplifiers are not successively driven between conductive and non-conductive states during the normal amplifying operation. Nevertheless, Class A amplifiers are not generally used when a relatively high power output such as necessary to drive a high fidelity speaker system is required. The reason for this is that conventional Class A amplifiers have their active amplifying devices in conductive states at all times, which, in turn, means that such devices continuously dissipate power, thereby requiring special cooling and heat dissipating means. Also, conventional Class A amplifiers generally have low efficiency.

As a result, Class AB and Class B type amplifiers have previously been preferred when high output power is required, even though fidelity is compromised. For example, although a Class AB amplifier has an efficiency advantage relative to a Class A amplifier, its active amplifying devices are successively driven between this conductive and non-conductive states during normal operation. In a Class AB amplifier, each active amplifying device is in a non-conductive state for somewhat less than one-half of the total time. In a Class B amplifier, on the other hand, each active amplifying device is in a non-conductive state approximately one-half of the time. in each case, the active amplifying devices are successively driven between conductive and non-conductive states.

As noted above, it has long been recognized that the successive switching of the active amplifying elements between conductive and non-conductive states results in discontinuities and transitional gain variations which are ultimately audible as a distortion generally referred to as cross-over distortion. The discontinuities and gain variations are, of course, also readily detectible and measureable using conventional test procedures and instruments.

The precise mechanism which produces cross-over distortion depends upon the type of active amplifying devices or elements. In the case of amplifiers using bipolar transistors, the discontinuities and transitional gain variations can be explained by consideration of the physical electronics of bipolar transistors. It is well known, for example, that bipolar transistors are essentially current operated devices, and that the base-emitter voltage determines the amount of electronic charge stored at the base-emitter junction due to the effective capacitance of the junction. When a bipolar transistor is driven into the non-conductive state, an increasing amount of charge is stored at the base-emitter junction, depending upon the magnitude of the base-emitter voltage. Thus, when current provided to base of the transistor seeks to drive the transistor back to a conductive state, the effect of the charge stored at the base-emitter junction must first be overcome before true linear amplification can again be achieved when the transistor is restored to the conductive state. This produces discontinuities and so-called transitional gain variations which lead to cross-over distortion. Similar effects occur in amplifiers using field effect transistors (FETs) or vacuum tubes, both of which types of devices are essentially voltage operated devices. With an FET, electronic charge store also occurs at the semi-conductor junctions when the device is driven to a non-conductive state. Transitional gain variations and discontinuities are also experienced when vacuum tubes are driven successively between conductive and non-conductive states.

Others have recognized these problems and proposed various solutions. For example, U.S. Pat. No. 3,995,228 to Pass discloses an active bias circuit which essentially increases or alters the bias provided to the active amplifying elements based upon the instantaneous demand created by the input signal to be amplified. The bias is varied to prevent the active amplifying devices from transitioning to their non-conductive states. Although Pass' approach offers advantages relative to the prior art, the active bias circuit itself must be carefully designed to track the variations in the input signal to be amplified. Indeed, Pass' active bias circuit involve separate amplifiers which depend on sensing the base to emitter voltages across the bipolar transistors.

U.S. Pat. No. 3,883,813 to Seikya similarly discloses a low frequency power amplifier said to be adaptable for operation as either a Class AB or Class B amplifier. An active bias circuit is provided to track the input signal and provide a bias current flow through the power transistors to prevent what Seikya refers to as a "notching" distortion. U.S. Pat. No. 3,543,173 to Edgerton appears to disclose a Class B amplifier using an emitter follower configuration and provided with an active bias circuit means to maintain current flow over the range of normal input signals. Again, the effectiveness of Edgerton's apparatus depends upon the tracking ability of the active bias circuit. U.S. Pat. No. 4,025,871 to Peil and U.S. Pat. No. 3,686,580 to Van Den Plassche disclose other amplifier circuits including active bias circuit means for preventing bipolar transistor amplifiers from switching to the non-conductive states during normal input signal conditions.

Similarly, U.S. Pat. No. 4,015,212 to Miyata discloses an amplifier using FET transistors and again having an active bias source intended to minimize the cross-over distortion.

SUMMARY OF THE INVENTION

According to the present invention, a high fidelity power amplifier circuit is provided with means for preventing the active amplifying devices in the amplifier from being successively driven between their conductive and non-conductive states, thereby eliminating transitional gain variations and discontinuities, and resulting cross-over distortion. An amplifier according to the present invention includes a pair of cooperating active amplifying devices, each having its control input (e.g. base, gate, grid) operatively connected to an input means to each receive signals to be amplified derived from the input signal to the amplifier. A bias means is operatively connected to the active amplifying devices to establish their respective operating points, and is selected to maintain each of the active amplifying devices in a conductive state when no input signal is provided to the amplifier. The bias means further includes at least two diodes connected in at least two distinct signal pathways directly associated with the active amplifying devices. The diodes thus connected cause the active amplifying devices to be maintained in their conductive states for all normal input signals to the amplifier. This occurs because the bias reference points for the active amplifying devices are effectively shifted by the diodes as part of the bias means. The amplifier further includes an output means operatively connected to each of the active amplifying devices for cooperatively combining their respective output signals to provide the amplified output signal from the amplifier.

Accordingly, an object of the present invention is to provide an improved high fidelity audio power amplifier which operates as a true Class A amplifier.

Another object of the present invention is to provide a true Class A high fidelity power amplifier having a high degree of efficiency compared to conventional Class A amplifiers.

Still another object is to provide a relatively simple and inexpensive technique for modification of conventional Class AB and Class B high fidelity power amplifiers to convert such amplifiers to true Class A operation according to the present invention to avoid discontinuities and transitional gain variations, and minimize cross-over distortion.

A still further object of the present invention is to provide means for accomplishing the foregoing in amplifiers using bipolar transistors, FET transistors, and/or vacuum tubes as the active amplifying devices.

These and other objects and other novel and distinct features of the present invention will become apparent from the following detailed description, including the following drawings in which:

DESCRIPTION OF THE PREFERRED EMBODIMENT

Figure 1:
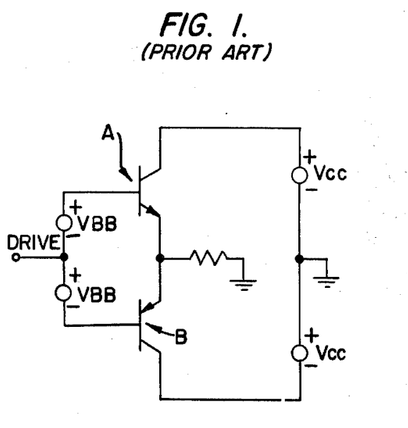
FIG. 1 is a schematic diagram illustrating certain features of a prior art bipolar transistor amplifier circuit.

As shown in FIG. 1, an NPN bipolar transistor A and a PNP transistor B are connected to a load resistor $R_L$ in a well known push-pull type amplifier circuit using constant voltage power supplies $V_{CC}$. This amplifier circuit also uses constant voltage sources $V_{BB}$ as shown to establish the bias and set the operating points for the transistors A and B. The input drive signal to the amplifier is provided at the drive terminal as shown. For typical operation in a high fidelity audio power amplifier, the values for $V_{BB}$ are appropriately selected to bias the transistors A and B so that the amplifier will operate as either a Class AB or a Class B type amplifier.

With the arrangement of FIG. 1, the sum of the base to emitter voltages (i.e. $V_{BEA}+V_{BEB}$) for the two transistors A and B is a constant, $2V_{BB}$. The base to emitter voltage, $V_{BE}$, for a given transistor also depends upon the collector current $I_c$ through the particular transistor, and also determines, for example, whether the particular transistor is in a conductive or non-conductive state. When an alternating current drive signal is applied at the drive input terminal of the amplifier, generally one or the other of the two transistors will be switched or driven to its non-conductive state at a given point in time. Also an alternating current input signal produces successive switching of the two transistors between their respective conductive and non-conductive states, which, in turn, leads to discontinuities and transitional gain variations, producing the type of distortion referred to as cross-over distortion, as previously described.

Figure 2:
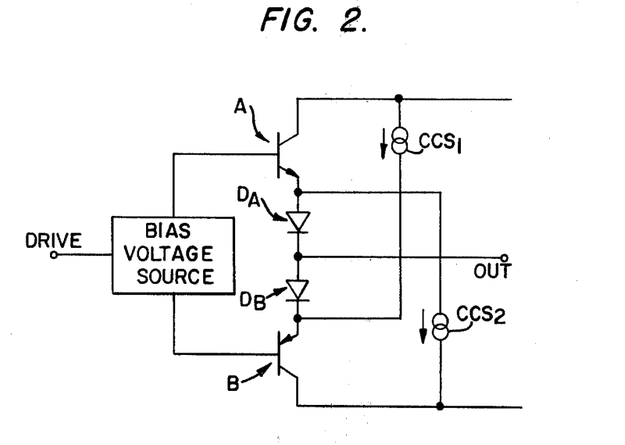
FIG. 2 is a partial schematic, partial block diagram showing one embodiment of the present invention as adapted to the basic amplifier circuit of FIG. 1.

As shown in FIG. 2, the approach of the present invention to overcome these problems is to modify the basic amplifier circuit arrangement of FIG. 1. The modification is made in a manner which leaves the bias means of the original circuit intact. The approach of the present invention permits this by changing the reference point for the bias voltage on each transistor, rather than by varying the bias voltage, for example, by attempting to track the input driving signal.

As seen from FIG. 2, a drive input is provided through a bias constant voltage source as in FIG. 1. Signals derived from the input driving signal applied through an input means including the bias voltage source are applied to the base or control inputs of a pair of transistors A and B. The transistors A and B are arranged as a pair of cooperating active amplifying devices, and the bias voltage source is appropriated selected to maintain each of the transistors in its conductive state when no input signal is provided to the amplifier. As further shown in FIG. 2, a diode $D_A$ is connected in a signal pathway in the emitter circuit of the NPN transistor A as shown, and a similar diode $D_B$ is similarly inserted in the emitter circuit of the PNP transistor B. A first constant current source $CCS_1$ is connected between the collector of the transistor A and the emitter of the transistor B. A similar second constant current source $CCS_2$ is connected between the collector of the transistor B and the emitter of transistor A. The respective collector terminals of transistors A and B are connected to voltage source power supplies (not shown) such as the power supplies $V_{CC}$ as shown in FIG. 1. The output from the two active amplifying devices is cooperatively combined in an output means including a common connection point and an output terminal OUT as shown in FIG. 2. The common connection point is between the two diodes $D_A$ and $D_B$ as shown and the output terminal is adapted to be connected to a load (not shown) such as the resistive load $R_L$ in FIG. 1. In a practical high fidelity amplifier system, the output load would, in certain instances, be a high fidelity speaker system.

With the circuit arrangement of FIG. 2, whichever of the two transistors A and B is not providing power amplification at a given instant, is, nevertheless, maintained in its conductive state because a new bias reference point is provided for the bias voltage applied to the transistor. This result is achieved by use of the two diodes, each connected in a distinct signal pathway directly associated with one of the two transistors. As an input drive signal to the amplifier becomes increasingly positive, for example, the drive applied to the base or control input of the NPN transistor A becomes increasingly positive, thereby causing the transistor A to conduct more than the PNP transistor B. This causes the collector current through the transistor A to increase and the base to emitter voltage, $V_{BEA}$, of the transistor A also increases. As long as the bias constant voltage, less the base to emitter voltage $V_{BEA}$, is of sufficient magnitude to maintain both the PNP transistor B and the diode B in a forward biased condition, most of the current flowing through the transistor B will flow through the diode $D_B$. However, when the base to emitter voltage, $V_{BEB}$, of the PNP transistor B decreases to a point at which the collector current through the transistor B equals the amount of current available from the constant current source $CCS_1$, the diode $D_B$ will then become back biased as a result, the diode $D_B$ itself will no longer be in a conductive state.

At such time, however, $V_{BEB}$ will be referenced to the voltage associated with the constant current source $CCS_1$, and not to the common emitter connection point between the two transistors A and B, because, as just noted, the diode $D_B$ will be effectively non-conductive. As a result, the transistor B will be in an idling condition as far as its contribution to the amplifying operation of the amplifier is concerned. Nevertheless, the transistor B will be maintained in its conductive state, independently of the amplification being provided by the transistor A. Thus, it is seen that the PNP transistor B never is switched or driven to the non-conductive state.

Further study of FIG. 2 should make it apparent that the operation of the diode $D_A$ in direct association with the transistor A is similar to that just described for the diode $D_B$ in direct association with the transistor B. It should further be apparent that it is necessary to appropriately select the constant bias voltage source was well as the constant current sources, $CCS_1$ and $CCS_2$, to achieve operation as described. The magnitude of the voltage source and the current sources, respectively, will depend upon the range of the normal input drive signals to be provided to the amplifier.

As will be further seen, the basic approach and of the present invention is readily adaptable to all forms of push-pull amplifier output systems, both quasi-complementary, and full complementary, symmetric, as well as common-emitter and common-collector, series or totem pole type arrays, and similar amplifier systems. It will be further seen that the basic approach of the present invention is adaptable for use in amplifiers in which the active amplifying devices or elements are bipolar transistors, field effect transistors, vacuum tubes, or some other combination of active amplifying elements.

Figure 3A:
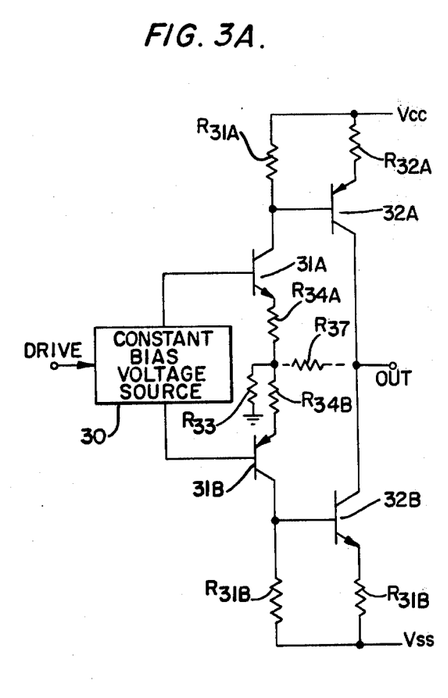
FIG. 3A is a partial schematic, partial block diagram of a prior art complementary, symmetric, common-emitter bipolar transistor amplifier circuit.

FIG. 3A shows a complementary, symmetric, common-emitter amplifier circuit of a well known type in which the drive input signal to the amplifier is provided by way of an input means cooperating with a constant bias voltage source 30. The two output terminals of the source 30 are connected to the control or base inputs of an NPN transistor 31A and a PNP transistor 31B. The input means and bias constant voltage source is similar to that shown in FIG. 1. The collector terminals of the transistors 31A and 31B are connected, respectively, to the bases of another pair of transistors, a PNP transistor 32A and an NPN transistor 32B, and also to one terminal of a resistor $R_{31A}$ and a resistor $R_{31B}$, respectively. The emitters terminals of the transistors 32A and 32B are connected to one terminal of a resistor $R_{32A}$ and a resistor $R_{32B}$ respectively. The other terminals of the resistors 31A and 32A are connected together and further connected to a voltage source $V_{CC}$ of a power supply (not shown). The other terminals of the resistors $R_{31B}$ and $R_{32B}$ are similarly connected together and further connected to a voltage source $V_{SS}$ of a power supply (not shown). The emitter terminals of the transistors 31A and 31B are connected, respectively, to one terminal of a resistors $R_{34A}$ and a resistor $R_{34B}$. The other terminal of the resistors $R_{34A}$ and $R_{34B}$ are connected together and also connected to one terminal of another resistor $R_{33}$, the other terminal of which is connected to ground. The collector terminals of the transistors 32A and 32B are connected together at a common connection point also connected to the output terminal OUT of the amplifier. The output terminal is adapted to be connected to an output load (not shown) such as the resistor $R_L$ of FIG. 1. Also shown in FIG. 3A is a resistor $R_{37}$ which may, optionally, be connected between the common connection point for the collectors of the transistors 32A and 32B and the connection point between the resistors $R_{34A}$ and $R_{34B}$ to facilitate balancing of the amplifier circuit.

Figure 3B:
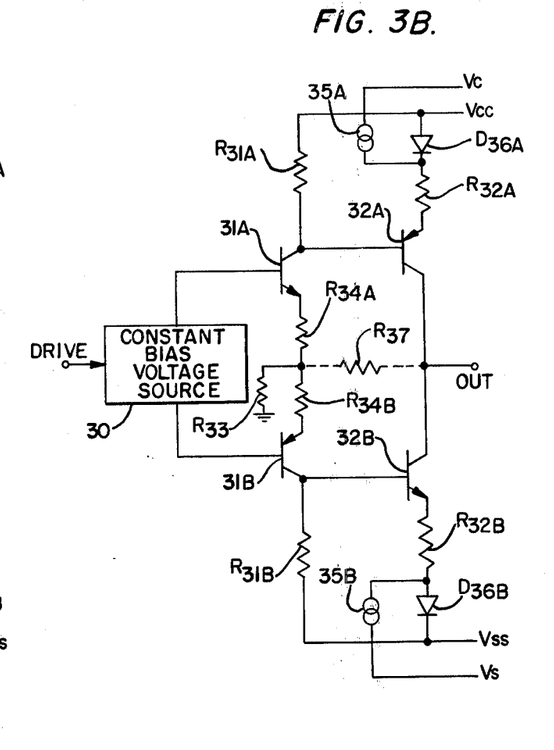
FIG. 3B shows an embodiment of the present invention adapted to the basic amplifier circuit of FIG. 3A.
Figure 3C:
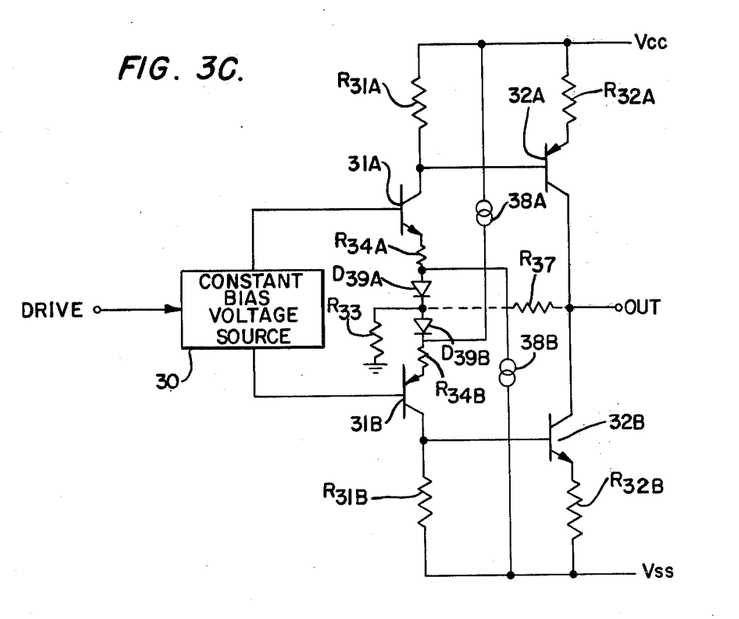
FIG. 3C shows an alternative embodiment of the present invention adapted to the basic amplifier circuit of FIG. 3A.

The amplifier circuit of FIG. 3A performs in a well-known manner as a Class AB or Class B amplifier. FIGS. 3B and 3C present two alternative embodiments of the present invention incorporated into the basic amplifier circuit of FIG. 3A. Elements in FIG. 3B and 3C having the same letter or numeral identifiers as in FIG. 3A perform substantially the same functions as in FIG. 3A.

As shown in FIG. 3B, a diode $D_{36A}$ is inserted in the signal pathway directly associated with the emitter circuit of the transistor 32A. The diode $D_{36A}$ is connected between the resistor $R_{32A}$ and the common connection point between the voltage source $V_{CC}$ and the resistor $R_{31A}$. Also, a constant current source 35A is connected at one terminal to supply constant current to the node including the diode $D_{36A}$ and the resistor $R_{32A}$ and at the other terminal to a voltage source $V_C$ having a greater magnitude than the voltage source $V_{CC}$. A similar diode $D_{36B}$ has been inserted in a signal pathway directly associated with the transistor 32B. A similar constant current source 35B is connected at one terminal to the node including the resistor $R_{32}$ and the diode $D_{36B}$, and at the other terminal to a voltage source $V_S$ having a magnitude greater than the voltage source $V_{SS}$. With appropriate selection of the constant current sources 35A and 35B and the bias constant voltage source 30, it is possible with this modified amplifier circuit as compared to FIG. 3A, to achieve amplifying operation in which the active amplifying devices are prevented from being driven into their non-conductive states for a normal range of input drive signals to the amplifier. It is noted that the term "active amplifying device" encompasses a single transistor such as the transistor 32A as well as a pair of connected transistor such as the transistors 31A and 32A.

An alternative embodiment according to the present invention is shown in FIG. 3C in which a diode $D_{39A}$ is inserted in a signal pathway between one terminal of the resistor $R_{34A}$ and the ungrounded terminal of the resistor $R_{33}$. This signal pathway, is, of course, directly associated with the emitter circuit of the transistor 31A. Similarly, a diode $D_{39B}$ is inserted in a signal pathway directly associated with the emitter circuit of the transistor 31B between the resistor $R_{34B}$ and the ungrounded terminal of the resistor $R_{33}$. Also, a constant current source 38B is connected between the voltage source $V_{SS}$ and the connection point between the diode $D_{39A}$ and the resistor $R_{34A}$ to provide a constant current to that node. A similar constant current source 38A is similarly connected between the voltage source $V_{CC}$ and the connection point between the diode $D_{39B}$ and the resistor $R_{34B}$ to provide a constant current to that node.

Again, it is seen that this amplifier circuit will produce true Class A amplifier operation with appropriate selection of the constant current source 38A and 39B and the source 30. With such Class A operation neither of the cooperating active amplifying devices will be driven into its non-conductive state over the range of normal drive input signals to the amplifier. As previously noted an "active amplifying device" may be considered to be either a single transistor such as the transistor 32A or a connected pair of transistors such as the transistors 31A and 32A.

Figure 4A:
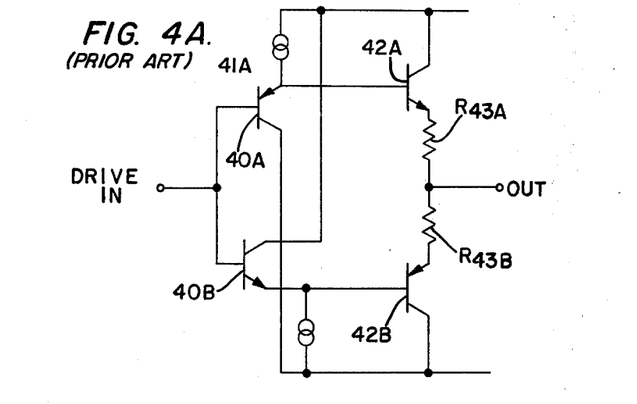
FIG. 4A is a partial schematic, partial block diagram showing a prior art, common collector, bipolar transistor amplifier circuit.

FIG. 4A shows a self-biased common-collector type amplifier circuit. It is noted that the basic amplifier circuit of FIG. 4A is similar to a high fidelity audio amplifier circuit in apparatus manufactured and sold by Nakamichi and Audio Research Corporation.

As shown in FIG. 4A, a PNP transistor 40A and an NPN transistor 40B each have their respective base terminals connected to the input drive terminal of the amplifier. The emitter terminal of the transistor 40A is connected to the base terminal of an NPN transistor 42A and also to one terminal of a constant current source 41A. Similarly, the emitter terminal of the transistor 40B is connected to the base terminal of a PNP transistor 42B and also to one terminal of a constant current source 41B. The other terminal of the constant current source 41A is connected to the collector terminal of the transistor 42A which, in turn, is connected to an appropriate voltage source (not shown). The collector of the transistor 42A is also connected to the collector of the transistor 40B. Similarly, the other terminal of the constant current source 41B is connected to the collector of the transistor 42B which, in turn, is connected to an appropriate voltage source (not shown). Also, the collector of the transistor 42B is connected to the collector of the transistor 40A.

As further shown, the emitter terminal of the transistor 42A is connected to one terminal of a resistor $R_{43A}$. The emitter terminal of the transistor 42B is similarly connected to one terminal of a resistor $R_{42B}$. The other terminals of the resistors $R_{43A}$ and $R_{43B}$ are connected to a common connection point adapted to be connected to the output load (not shown) of the amplifier by means of the output terminal OUT. This circuit arrangement, with appropriate selection of the constant current sources 41A and 41B, the power supply voltage sources (not shown), and the resistors $R_{43A}$ and $R_{43B}$, produces so-called "self-biasing" amplifier operation typically selected so that the amplifier operates as either a Class AB or Class B amplifier for the normal range of input drive signals.

Figure 4B:
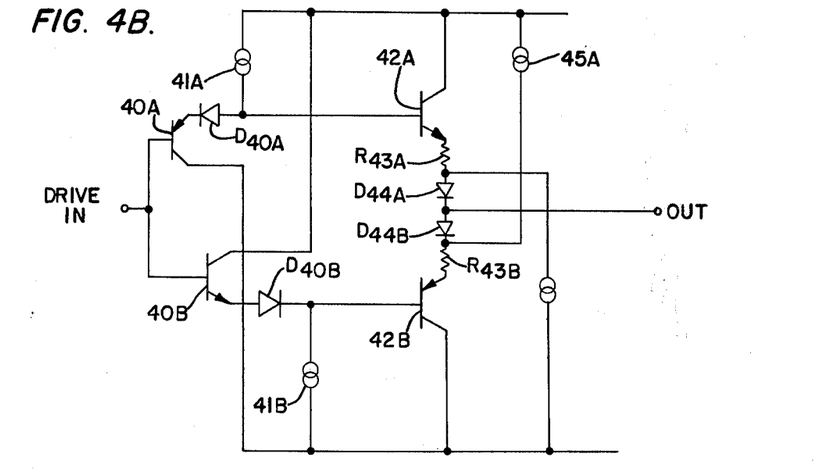
FIG. 4B shows an embodiment of the present invention adapated to the basic amplifier circuit of FIG. 4A.

FIG. 4B shows the basic amplifier circuit of FIG. 4A modified according to the present invention to achieve true Class A amplifier operation over the full range of normal input drive signals. The elements in FIG. 4B having the same letter or numeral identifiers as in FIG. 4A operate in a similar manner and are similarly connected as described for FIG. 4A. As seen in FIG. 4B, the common connection point between resistors $R_{43A}$ and $R_{43B}$ has been broken, and instead, one terminal of a diode $D_{44A}$ is connected to the terminal of the resistors $R_{43A}$ formerly connected to the common connection point. Similarly, one terminal of a diode $D_{44B}$ is connected to the terminal of the resistor $R_{44B}$ formerly connected to the common connection point. The other terminals of the diodes $D_{44A}$ and $D_{44B}$ are connected to a common connection point which in turn is adapted to be connected to the output load (not shown) of the amplifier. A constant current source 45A is connected between the collector terminal of the transistor 42A and the common connection point between the diode $D_{43B}$ and the resistor $R_{44B}$ to supply constant current to that node. Similarly, another constant current source 45B is connected between the collector of the transistor 42B and the common connection point between the diode $D_{44A}$ and the resistor $R_{43A}$ to supply constant current to that node. Also, a diode $D_{40A}$ is also connected in the emitter circuit of the transistor 40A and a diode $D_{40B}$ is connected in the emitter circuit of the transistor 40B.

With this circuit arrangement it is seen that the diodes $D_{44A}$ and $D_{44B}$ and the diodes $D_{40A}$ and $D_{40B}$ are connected in distinct signal pathways directly associated with each of the active amplifying devices. As noted previously, the active amplifying devices can be considered to be a single transistor such as the transistor 42A or a pair of operatively associated, directly connected transistors such as the pair of transistors 40A and 42A. The current sources 45A and 45B are appropriatley selected so that the active amplifying devices will not be successively driven between their respective conductive and non-conductive states over the range of normal input drive signals to the amplifier, but instead will be maintained in their conductive states for all normal input drive signals.

Figure 5A:
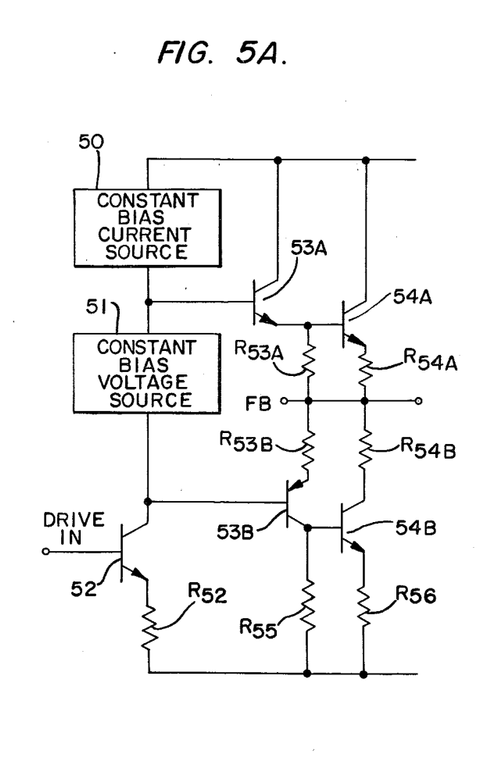
FIG. 5A is a partial schematic, partial block diagram of a prior art quasi-complementary, bipolar transistor amplifier.

FIG. 5A shows a quasi-complementary output amplifier circuit similar to a circuit referred to as a classic RCA amplifier of a type shown in RCA engineering texts. As shown in FIG. 5A the base of an NPN input circuit transistor 52 is connected to the input drive terminal of the amplifier and is adapted to receive the input drive signal to be amplified. The emitter terminal of the transistor 52 is connected to one terminal of a resistor $R_{52}$. The collector terminal of the transistor 52 is connected to one terminal of a bias constant voltage source 51 and also to the base terminal of a PNP transistor 53B. The collector terminal of the transistor 53B is connected to the base or control input terminal of an NPN transistor 54B and also to one terminal of a resistor $R_{55}$. The emitter terminal of the transistor 54B is connected to one terminal of a resistor $R_{56}$. The other terminals of the resistors $R_{52}$, $R_{55}$, and $R_{56}$ are connected to a common point which in turn is connected to a voltage source (not shown) provided by the power supply for the amplifier.

As further shown in FIG. 5A, the other terminal of the constant bias voltage source 51 is connected to the base terminal of an NPN transistor 53A and also to one terminal of a bias constant current source 50. The other terminal of the current source 50 is connected to the collector terminal of the transistor 53A and also to the collector terminal of another NPN transistor 54A. The common connection point between the current source 50 and the collectors of the transistors 53A and 54A is connected to a voltage source (not shown) provided by the power supply for the amplifier. As further shown in FIG. 5A, the emitter terminal of the transistor 53A is connected to the base terminal of the transistor 54A and also to one terminal of a resistor $R_{53A}$. The emitter terminal of the transistor 54A is connected to one terminal of a resistor $R_{54A}$, the emitter terminal of the transistor 53B is connected to one terminal of a resistor $R_{53B}$ and the collector terminal of the transistor 54B is connected to one terminal of a resistor $R_{54B}$. The other terminals of the resistors $R_{53A}$, $R_{53B}$, $R_{54A}$ and $R_{54B}$ are connected to a common connection point which is, in turn, connected to two terminals, OUT and FB. The terminal FB is adapted to be connected to provide a feedback signal to predecessor stages (not shown) in the overall amplifier (not shown) in a manner well known in the art. The terminal OUT is adapted to be connected to the output load (not shown) of the amplifier. The quasi-complementary amplifier circuit of FIG. 5A operates in a well known manner. Typically, the bias sources 50 and 51 are selected to cause the amplifier to operate as either a Class AB or a Class B amplifier.

Figure 5B:
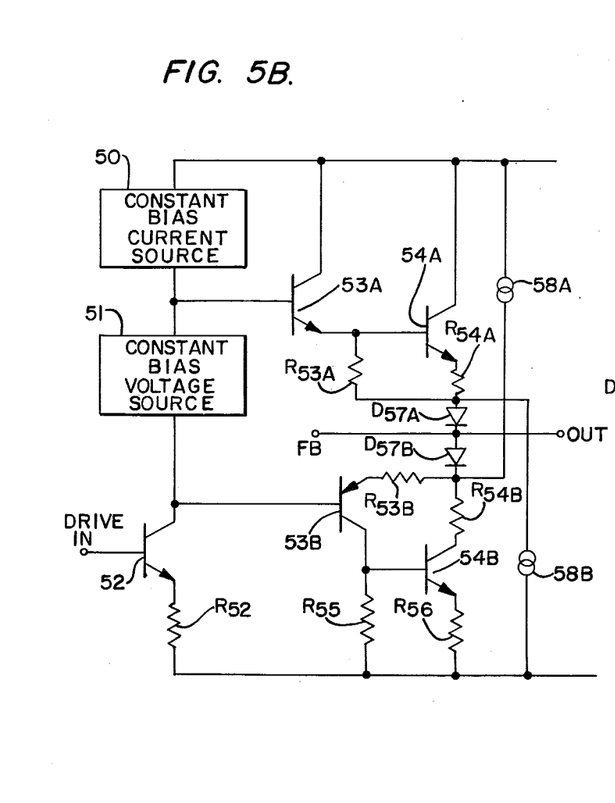
FIG. 5B shows an embodiment of the present invention adapted to the basic amplifier circuit of FIG. 5A.

FIG. 5B shows the basic amplifier circuit of FIG. 5A modified according to the present invention to achieve true Class A amplifying operation over the full range of normal input drive signals. The elements shown in FIG. 5B having the same numeral or letter identifiers as in FIG. 5A operate in a manner similar to that in FIG. 5A.

As shown in FIG. 5B, the present invention has been incorporated into the basic amplifier circuit of FIG. 5A by breaking the common connection between all of the resistors $R_{53A}$, $R_{54A}$, $R_{53B}$ and $R_{54B}$. Instead, only common connection points have been preserved between the first pair of resistors $R_{53A}$ and $R_{54A}$, and the second pair of resistors $R_{53B}$ and $R_{54B}$. One terminal of a diode $D_{57A}$ is connected to the common connection point of the resistors $R_{53A}$ and $R_{54A}$. Similarly, one terminal of a diode $D_{57B}$ is connected to the common connection point between the resistors $R_{53B}$ and $R_{54B}$. The other terminals of the diodes $D_{57A}$ and $D_{57B}$ have been connected to a common connection point to cooperatively combine the output signal from the respective portions of the amplifier. The common connection point between the diodes $D_{57A}$ and $D_{57B}$ is adapted to be connected to the output load (not shown) of the amplifier and also to provide feedback to the predecessor stages (not shown) of the overall amplifier (not shown) as previously described. As also shown, a constant current source 58A is connected between the collector terminal of the transistor 54A and the common connection point between the diode $D_{57B}$ and the resistors $R_{53B}$ and $R_{54B}$ to supply constant current to that node. Another constant current source 58B is similarly connected between the common connection point of the resistors $R_{52}$, $R_{55}$, and $R_{56}$ and the common connection point between the diode $D_{57A}$ and the resistors $R_{53A}$ and $R_{54A}$ to supply constant current to that node. The current supplied by these constant current sources 58A and 58B is appropriately selected so that the amplifier of FIG. 5B will achieve true Class A operation over the normal range of input drive signals.

Figure 6A:
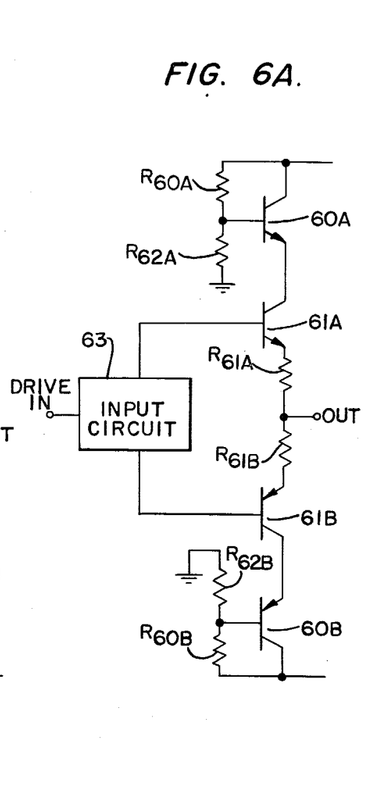
FIG. 6A is a partial schematic, partial block diagram of a prior art complementary, symmetric, series or "totem pole" amplifier using bipolar transistors.

FIG. 6A shows a complementary, symmetric, series or totem pole, amplifier of a well known type. As shown in FIG. 6A the input drive signal to be amplified is provided to an input circuit 63, the outputs of which are connected, respectively, to the base terminals of an NPN transistor 61A and a PNP transistor 61B. The collector terminal of the transistor 61A is connected to the emitter terminal of an NPN transistor 60A, the collector of which is connected to one terminal of a resistor $R_{60A}$ and also to a voltage source (not shown) provided by the power supply for the amplifier. The other terminal of the resistor $R_{60A}$ is connected to the base terminal of the transistor 60A and also to one terminal of a resistor $R_{62A}$, the other terminal of which is connected to ground. Similarly, the collector terminal of the transistor 61B is connected to the emitter terminal of a PNP transistor 60B, the collector of which is connected to one terminal of a resistor $R_{60B}$ and also to a voltage source (not shown) provided by the power supply for the amplifier. The other terminal of the resistor $R_{60B}$ is connected to the base terminal of the transistor 60B and also to one terminal of a resistor $R_{62B}$, the other terminal of which is connected to ground. As further shown, the emitter terminal of the transistor 61A is connected to one terminal of a resistor $R_{61A}$. Similarly, the emitter terminal of the transistor 61B is connected to one terminal of a resistor $R_{61B}$. The other terminals of the resistors $R_{61A}$ and $R_{61B}$ are connected to a common connection point to cooperatively combine the output signals from the respective active amplifying devices in the amplifier. This common connection point is further connected to a output terminal and is adapted to be connected to the output load (not shown). The biasing resistors and the power supply voltages are typically selected so that the amplifier according to FIG. 6A will operate as either a Class AB or Class B amplifier.

Figure 6B:
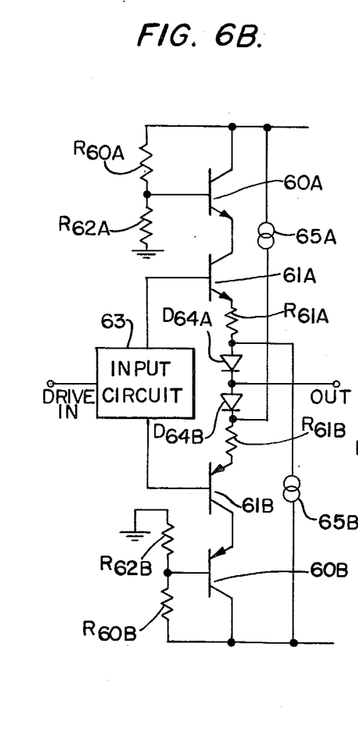
FIG. 6B shows an embodiment of the present invention adapted to the basic amplifier circuit of FIG. 6A.

FIG. 6B shows the basic amplifier circuit of FIG. 6A modified according to the present invention. Elements having the same numeral or letter identifiers in FIG. 6B as in FIG. 6A perform similar functions. As shown in FIG. 6B, the common connection point between the resistor $R_{61A}$ and $R_{61B}$ as shown in FIG. 6A has been broken. The terminal of the resistor $R_{61A}$ previously connected to the common connection point in FIG. 6A is, instead, are connected to one terminal of a diode $D_{64A}$. Similarly, the terminal of the resistor $R_{61B}$ previously connected in FIG. 6A to the common connection point is, instead, connected to one terminal of a diode $D_{64B}$. The other terminals of the diodes $D_{64A}$ and $D_{64B}$ connected together to form a common connection point to cooperatively combine the output signals of the respective active amplifying devices of the amplifier. It is noted that distinct signal pathways exist through the two diodes, each of which is directly associated with an active amplifying device in the amplifier circuit. As also shown, a constant current source 65A is connected between the collector terminal of the transistor 60A and the common connection point between the diode $D_{64B}$ and the resistor $R_{61B}$ to provide constant current to that node. Similarly, a constant current source 65B is connected between the collector terminal of the transistor 60B and the common connection point between the resistor $R_{61A}$ and the diode $D_{64A}$ to provide constant current to that node. The common connection point between the diodes $D_{64A}$ and $D_{64B}$ is connected to the output terminal which is adapted to be connected to the output load (not shown).

Accordingly, it is seen that the basic amplifier circuit of FIG. 6A may be readily modified to incorporate apparatus according to the present invention to cause the active amplifying devices to achieve true Class A operation over the full normal range of input drive signals to be amplified. To achieve this, it is necessary to appropriately select the current levels supplied by the constant sources 65A and 65B as previously described.

Figure 7A:
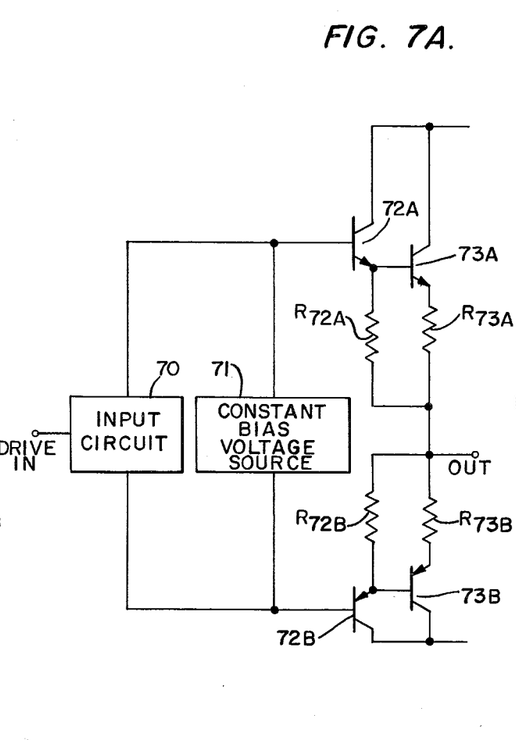
FIG. 7A is a partial schematic, partial block diagram of a prior art complementary, symmetric, common collector Darlington amplifier circuit.

FIG. 7A shows a complementary, symmetric, common-collector, Darlington type amplifier circuit of a well known type. An input drive signal is applied to an input circuit 70 which provides output signals derived from the input signals and connected respectively, to the base terminals of an NPN transistor 72A and a PNP transistor 72B. A bias constant voltage source 71 is also connected between the base terminals of the transistors 72A and 72B. The emitter terminal of the transistor 72A is connected to one terminal of a resistor $R_{72A}$ and also to the base terminal of an NPN transistor 73A. Similarly, the emitter terminal of the transistor 72B is connected to one terminal of a resistor $R_{72B}$ and also to the base terminal of a PNP transistor 73B. The collector terminals of the transistors 72A and 72B are connected together and also to a voltage source (not shown) provided by the power supply. Similarly, the collectors of the transistors 72B and 73B are connected together and also to a voltage source (not shown) provided by the power supply. The emitter terminal of the transistor 73A is connected to one terminal of a resistor $R_{73A}$. Similarly the emitter terminal of the transistors 73B is connected to one terminal of a resistor $R_{73B}$. The other terminals of the resistors $R_{72A}$, $R_{73A}$, $R_{72B}$, and $R_{73B}$ are connected to a common connection point which is connected to the output terminal OUT of the amplifier to drive an output load (not shown). Accordingly, it is seen that this circuit constitutes a complementary, symmetric, common-collector Darlington type amplifier circuit of a well known type. Typically, the bias levels are so selected so that the amplifier circuit of FIG. 7A will operate either as a Class AB or a Class B amplifier.

Figure 7B:
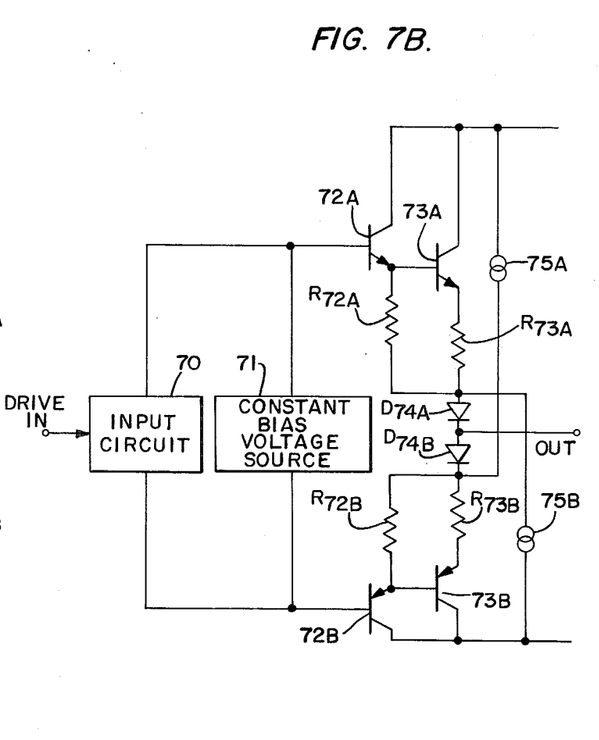
FIG. 7B shows an embodiment of the present invention adapted to the basic amplifier circuit of FIG. 7A.

FIG. 7B shows apparatus according to the present invention added to the basic amplifier circuit of FIG. 7A to cause the basic amplifier circuit to operate as a true Class A amplifier. Elements in FIG. 7B having the same numeral or letter identifiers are connected in a manner similar to that shown in FIG. 7A and operate in a similar manner. As shown in FIG. 7B, the common connection point between the resistors $R_{72A}$, $R_{73A}$, $R_{72B}$ and $R_{73B}$ in FIG. 7A has been broken. Instead, only common connections points between the first pair of resistors $R_{72A}$ and $R_{73A}$, and the second pair of resistors $R_{72B}$ and $R_{73B}$ have been preserved. One terminal of a diode $D_{74A}$ is connected to the common connection point between the resistor $R_{72A}$ and $R_{73A}$. Similarly, one terminal of a diode $D_{74B}$ is connected to the common connection point between the resistors $R_{72B}$ and $R_{73B}$. The other terminals of the diodes $D_{74A}$ and $D_{74B}$ are connected to a common connection point to cooperatively combine the amplified signals provided by the respective portions of the amplifier and to drive an output load (not shown) connected to the output terminal "OUT". Also, a constant current source 75A is connected between the collector terminal of the transistor 73A and the common connection point between the diode $D_{74B}$ and the resistors $R_{72B}$ and $R_{73B}$ to provide constant current to that node. Similarly, a constant current source 75B is connected between the collector terminal of the transistor 73B and the common connection point between the diode $D_{74A}$ and the resistors $R_{72A}$ and $R_{73A}$ to provide constant current to that node. As previously described, the current supplied by the constant current sources 75A and 75B is appropriately selected so that the active amplifying devices in the amplifier circuit of FIG. 7B will operate as a true Class A amplifier for the full range of normal input drive signals to the amplifier.

Figure 8A:
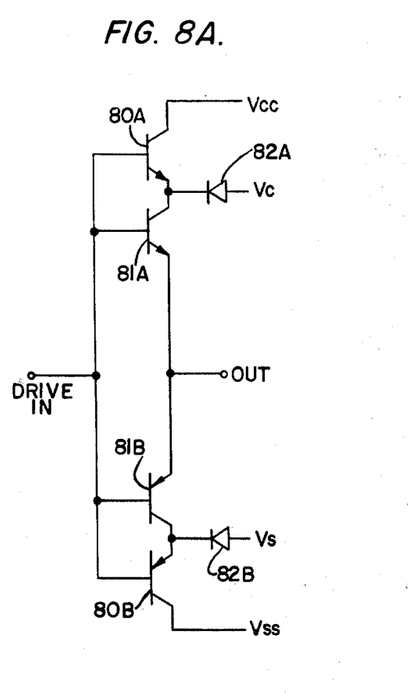
FIG. 8A is a partial schematic, partial block diagram of another prior art amplifier circuit.

FIG. 8A shows a prior art amplifier of a type typical of the so-called "Class G" amplifier used in high fidelity audio amplifiers manufactured and sold by the Hitachi. An input drive signal is connected to the base terminals of four transistors, NPN transistors 80A and 81A, and PNP transistors 80B and 81B. The collector terminal of the transistor 80A is connected to a voltage source $V_{CC}$ provided by the power supply. Similarly, the collector terminal of the transistor 80B is connected to a voltage source $V_{SS}$ provided by the power supply. The emitter terminal of the transistor 80A is connected to the collector terminal of the transistor 81A and also to one terminal of a diode 82A, the other terminal of which is connected to a voltage source $V_C$ provided by the power supply. Similarly, the emitter terminal of the transistor 80B is connected to the collector terminal of the transistor 81B and also to one terminal of a diode 82B, the other terminal of which is connected to a voltage source $V_S$ also provided by the power supply. The emitter terminals of the transistors 81A and 81B are connected together and also to a terminal OUT adapted to drive an output load (not shown). This circuit performs in a well known manner and the values of the voltage sources $V_{CC}$, $V_C$, $V_S$ and $V_{SS}$ are appropriately selected so that the active amplifying devices are successively driven between their conductive and non-conductive states by normal input audio signals to the amplifier.

Figure 8B:
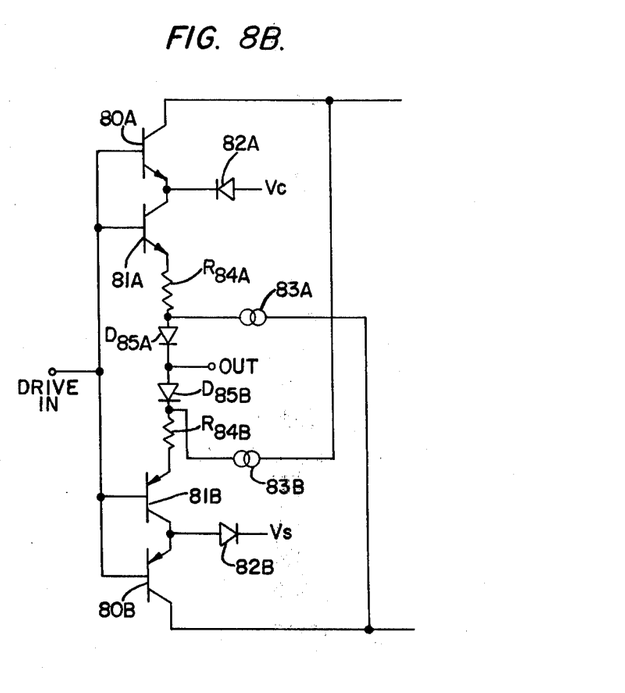
FIG. 8B shows an embodiment according to the present invention adapted to the basic amplifier circuit of FIG. 8A.

FIG. 8B shows apparatus according to the present invention incorporated into the basic amplifier circuit of FIG. 8A to cause the basic amplifier circuit to operate as a true Class A amplifier. Elements in FIG. 8B having the same numeral or letter identifiers are connected and operate in a manner similar to that previously described for FIG. 8A. As shown in FIG. 8B, the common connection point between the emitter terminals of the transistors 81A and 81B as exists in the circuit of FIG. 8A has been broken. Instead, the emitter terminal of the transistor 81A is connected to one terminal of a resistor $R_{84A}$, the other terminal of which is connected to one terminal of a diode $D_{85A}$. Similarly, the emitter terminal of the transistor 81B is connected to one terminal of a resistor $R_{84B}$, the other terminal of which is connected to one terminal of a diode $D_{85B}$. The other terminals of the diode $D_{85A}$ and $D_{85B}$ are connected to a common connection point to cooperatively combine the signals from their respective portions of the amplifier and to provide an output signal to the terminal OUT adapted to be connected to an output load (not shown) of the amplifier. As also shown, a constant current source 83A is connected between the collector terminal of the transistor 80B and the common connection point between the resistor $R_{84A}$ and the diode $D_{85A}$ to provide constant current to that node. Similarly, a constant current source 83B is connected between the collector terminal of the transistor 80A and the common connection point between the resistor $R_{84B}$ and the diode $D_{85B}$ to provide constant current to that node. With the circuit arrangement of FIG. 8B, and with appropriate selection of the current levels provided by the constant current sources 83A and 83B, true Class A amplifier operation can be achieved wherein none of the active amplifying devices will be successively driven between its conductive and non-conductive states over the full range of normal input drive signals to the amplifier.

Figure 9A:
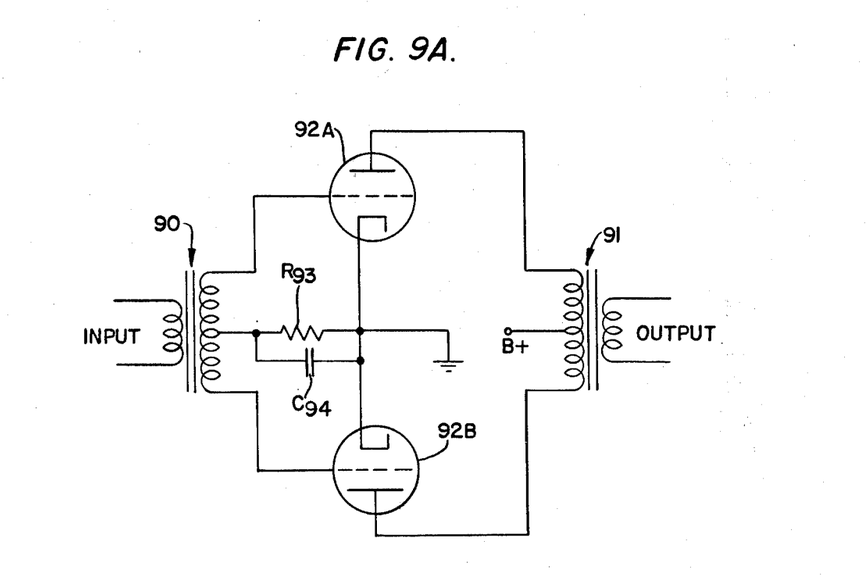
FIG. 9A is a schematic diagram of a prior art vacuum tube, push-pull amplifier circuit.

FIG. 9A shows a typical prior art vacuum tube push-pull amplifier. An input transformer 90 has a primary winding "input" adapted to be provided with an input signal to be amplified. The respective end terminals of a center tapped secondary winding of the transformer 90 are connected to the respective control or grid terminals of a pair of vacuum tubes 92A and 92B. The center tap terminal of the transformer 90 is connected to one terminal of a resistor $R_{93}$ and one terminal of a capacitor $C_{94}$, the other terminals of which are connected to ground. The cathode terminals of the vacuum tubes 92A and 92B are similarly connected to ground. The plate terminals of the vacuum tubes 92A and 92B are connected to the respective end terminals of a center tapped primary winding of an output transformer 91. The center tap of the primary winding of the output transformer 91 is connected to a source of plate voltage supply B+ as shown. The output signal from the push-pull amplifier circuit of FIG. 9A is provided on the secondary winding of the transformer 91. In typical operation, the power supply voltage B+ is appropriately selected in combination with the resistor $R_{93}$ and the capacitor $C_{94}$ so that the amplifier operates as either a Class AB or a Class B push-pull amplifier.

Figure 9B:
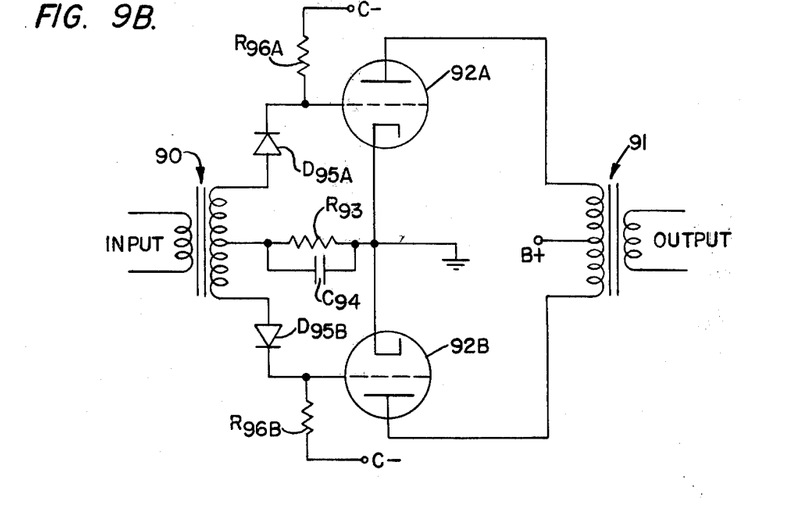
FIG. 9B shows one embodiment of the present invention adapted to the basic amplifier circuit of FIG. 9A.

FIG. 9B shows a modification to the basic amplifier circuit of FIG. 9A to incorporate apparatus according to the present invention to cause the active amplifying devices to achieve true Class A operation for the full range of normal input signals. Elements in FIG. 9B having the same numeral or letter identifiers as in FIG. 9A operate and are connected in the manner previously described. As shown in FIG. 9B, the direct connection between the respective end terminals of the secondary winding of the input transformer 90 and the grids of the vacuum tubes 92A and 92B have been broken. Instead, a diode $D_{95A}$ is connected between one end terminal of the secondary winding of the transformer 90 and the grid terminal of the tube 92A. Similarly, a diode $D_{95B}$ has been connected between the other end terminal of the secondary winding of the input transformer 90 and the grid terminal of the tube 92B. Also, the grids of the vacuum tubes 92A and 92B have been each connected, respectively, to one terminal of resistors 96A and 96B, the other terminals of which are connected to a negative voltage source C— as shown. Accordingly, it is seen that by appropriate selection of the voltage source C—, the two diodes $D_{95A}$ and $D_{95B}$ connected in distinct signal pathways directly associated with the active amplifying devices, will operate to cause the active amplifying devices to be maintained in their conductive states so that true Class A operation is achieved for the full normal range of input signals to the amplifier. It is noted, of course, that vacuum tubes 92A and 92B remain in their respective conductive states until the magnitude of the grid-to-cathode voltage exceeds a predetermined negative value.

Figure 9C:
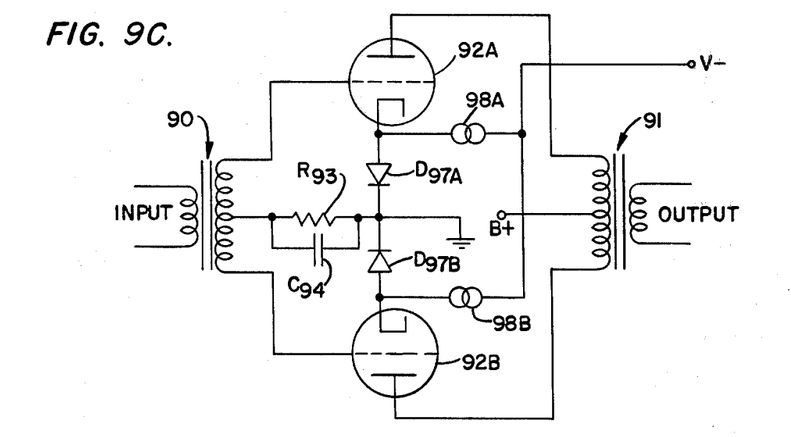
FIG. 9C shows an alternative embodiment of the present invention adapted to the basic amplifier circuit of FIG. 9A.

FIG. 9C shows an alternative embodiment of apparatus according to the present invention incorporated into the basic amplifier circuit of FIG. 9A. Again, elements in FIG. 9C are connected and operate as previously described. As shown in FIG. 9C, the direct connections between the cathode terminals of the vacuum tubes 92A and 92B and ground as shown in FIG. 9A have been broken. Instead, one terminal of a diode $D_{97A}$ is connected to the cathode terminal of the vacuum tube 92A and one terminal of a diode $D_{97B}$ is connected to the cathode terminal of the vacuum tube 92B. The other terminals of the two diodes $D_{97A}$ and $D_{97B}$ are connected to ground. As further shown in FIG. 9C, one terminal of a constant current source 98A is connected to the cathode of the vacuum tube 92A and one terminal of another constant current source 98B is connected to the cathode of the vacuum tube 92B. The other terminals of the two current sources constant current sources 98A and 98B are connected together and also to a constant voltage source V— provided by the power supply. Accordingly, it is seen that by appropriate selection of the current levels supplied by the current sources 98A and 98B and the value of the voltage supply V—, the diodes $D_{97A}$ and $D_{97B}$ connected in distinct signal pathways directly associated with each of the active amplifying devices will cause the amplifier of FIG. 9C to operate as a true Class A amplifier to the present invention.

Figure 10A:
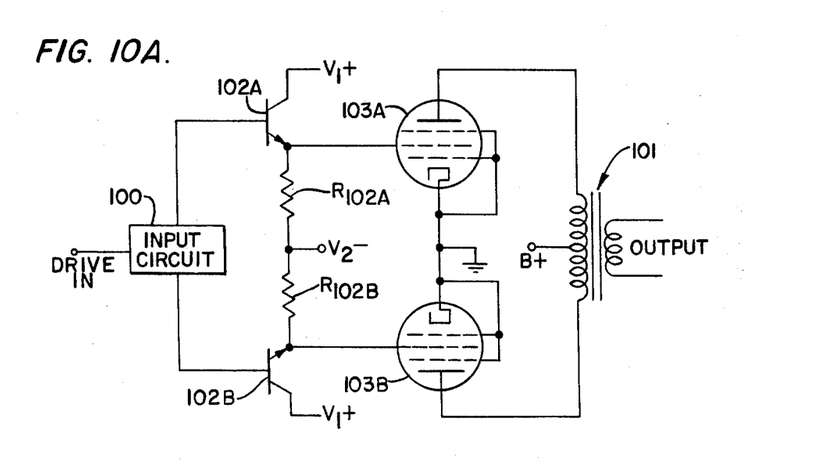
FIG. 10A is a partial schematic, partial block diagram of a prior art Berning amplifier circuit.

FIG. 10A shows a typical combination vacuum tube and bipolar transistor amplifier known as a Berning type amplifier. As shown in FIG. 10A, an input drive signal is provided to an input circuit 100, the outputs of which are connected to the base terminals of two NPN bipolar transistors, 102A and 102B. The collector terminals of each of the transistors 102A and 102B are connected to a voltage source $V_1+$ provided by the power supply for the amplifier. The emitter terminal of the transistor 102A is connected to the screen grid or control input of a pentode vacuum tube 103A and also to one terminal of a resistor $R_{102A}$. Similarly, the emitter terminal of the transistor 102B is connected to the screen grid or control input of a pentode vacuum tube 103B and also to one terminal of a resistor 102B. The other terminals of the resistors $R_{102A}$ and $R_{102B}$ are connected to a common connection point also connected to a voltage source $V_2-$ provided by the power supply. As further shown in FIG. 10A, the plate terminals of the tubes 103A and 103B are connected to the respective end terminals of a center tapped primary winding of an output transformer 101. The center tap of the primary winding of the output transformer 101 is connected to a plate voltage power supply B+. The amplified output signal from the amplifier is provided on the secondary winding of the output transformer 101. As further shown in FIG. 10A, the suppressor grids and control grids of the vacuum tubes 103A and 103B are connected together and to ground. The cathode terminals of the two vacuum tubes 103A and 103B are also connected to ground. This amplifier circuit operates in a well known manner and is typically operated as either a Class AB or a Class B amplifier.

Figure 10B:
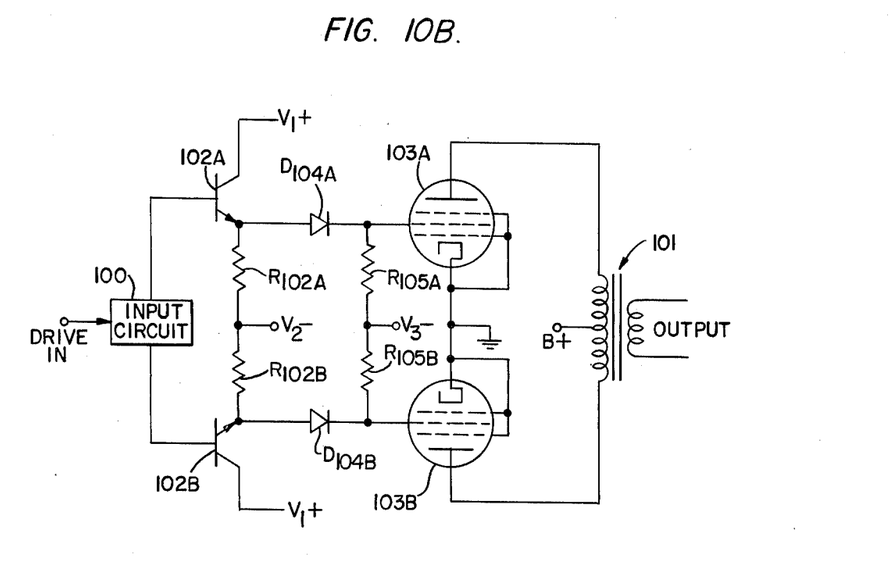
FIG. 10B shows an embodiment of the present invention adapted to the basic amplifier circuit of FIG. 10A.

FIG. 10B shows the basic amplifier circuit of FIG. 10A modified according to the present invention. Elements in FIG. 10B having the same numeral or letter identifiers as in FIG. 10A operate and are connected in a manner similar to that previously described. As shown in FIG. 10B, the connection in FIG. 10A between the screen grid of the tube 103A and the emitter terminal of the transistor 102A and one terminal of the resistor $R_{102A}$ has been broken. Similarly, the connection between the screen grid of the tube 103B and the emitter terminal of the transistor 102B and one terminal of the resistor $R_{102B}$ has been broken. Instead, one terminal of a diode $D_{104A}$ is connected to the common connection point between the emitter terminal of the transistor 102A and one terminal of the resistor $R_{102A}$. Similarly, one terminal of a diode $D_{104B}$ is connected to the common connection point between the emitter of the transistor 102B and one terminal of the resistor $R_{102B}$. The other terminal of the diode $D_{104A}$ is connected to the screen grid of the tube 103A. Similarly, the other terminal of the diode $D_{104B}$ is connected to the screen grid of the tube 103B. One terminal of a resistor $R_{105A}$ is also connected to the screen grid of the tube 103A. Similarly, one terminal of a resistor $R_{105B}$ is also connected to the screen grid of the tube 103B. The other terminals of the resistors $R_{105A}$ and $R_{105B}$ are connected to a common connection point which is also connected to a voltage source $V_3-$ provided by the power supply. With the circuit arrangement of FIG. 10B and with appropriate selection of the voltage $V_3-$, it is seen that the diodes $D_{104A}$ and $D_{104B}$ connected in distinct signal pathways directly associated with the active amplifying devices will cause the basic Berning amplifier circuit of FIG. 10A to operate as a true Class A amplifier for the full range of normal input drive signals to the amplifier. It is noted, of course, that the vacuum tubes 103A and 103B remain in their respective conductive states until the magnitude of the screen grid-to-cathode voltage exceeds a predetermined negative value.

Figure 11A:
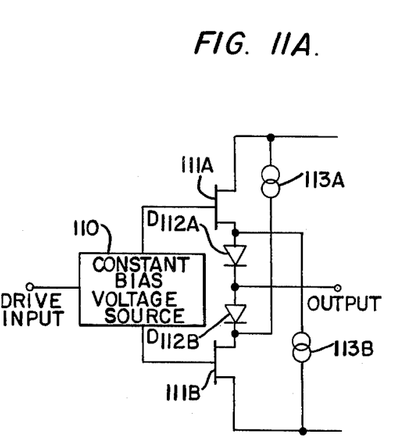
FIG. 11A is a partial block, partial schematic diagram of an FET amplifier circuit according to the present invention wherein diodes are connected to the sources of the FET transistors.

FIG. 11A shows one embodiment of the present invention adapted to an amplifier circuit using field effect transistors (FETs). An input drive signal to the amplifier FIG. 11A is provided to a bias constant voltage source 110, for example, a constant voltage source similar to that shown in FIG. 1. The outputs derived from the input signals to the amplifier from the constant bias voltage source 110 are connected to the respective gate inputs of a pair of FETs 11A and 11B. The respective drain terminals of the FETs 111A and 111B are connected to appropriate voltage sources (not shown) provided by the power supply. The source terminal of the FET 111A is connected to one terminal of a diode $D_{112A}$. Similarly, the source terminal of the FET 111B is connected to one terminal of a diode $D_{112B}$. The other terminals of the diodes, $D_{112A}$ and $D_{112B}$, are connected to a common connection point to cooperatively combine the amplified signals provided by the FETs 111A and 111B. The common connection point between the diodes, $D_{112A}$ and $D_{112B}$, is also connected to the output terminal which is adapted to be connected to the output load (not shown) of the amplifier. A constant current source 113A is also connected between the drain terminal of the FET 111A and the source terminal of the FET 111B. Similarly, a constant current source 113B is connected between the drain terminal of the FET 111B and the source terminal of the FET 111A. With this circuit arrangement, and with appropriate selection of the current levels provided by the respective constant current sources, 113A and 113B, it is seen that the active amplifying devices will be maintained in their conductive states at all times over the full range of normal input signals to the amplifier, thereby achieving true Class A operation.

Figure 11B:
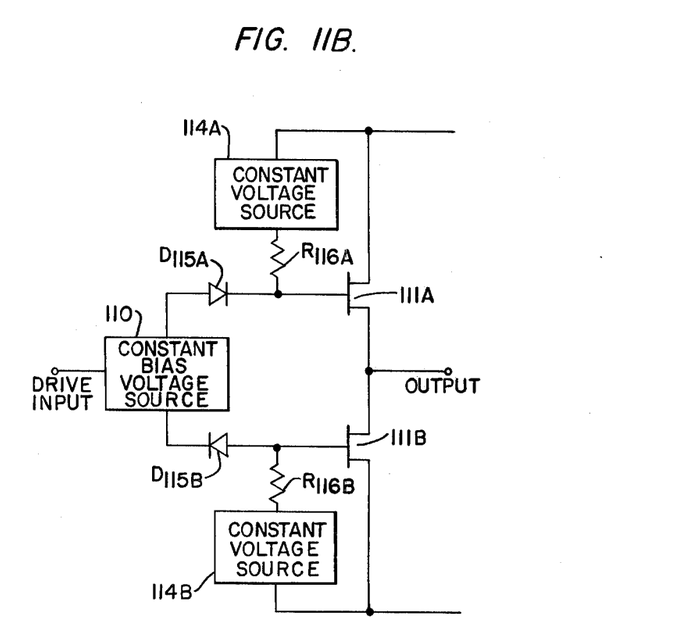
FIG. 11B is a partial block, partial schematic diagram of a similar FET amplifier circuit according to the present invention wherein diodes are connected to the gates of the FET transistors.

FIG. 11B shows an alternate embodiment of an FET amplifier according to the present invention. Certain of the elements in FIG. 11B have the same numeral or letter identifiers as in FIG. 11A, in which case, those elements operate in a manner similar to that described for the amplifier of FIG. 11A. As shown in FIG. 11B a drive input signal is provided to a constant bias voltage source 110. The first output of the constant bias voltage source 110 is connected to one terminal of a diode $D_{115A}$, the other terminal of which is connected to the gate input of the FET 111A. The second output of the constant bias voltage source 110 is connected to one terminal of a diode $D_{115B}$, the other terminal of which is connected to the gate input of the FET 111B. Also connected to the gate input of the FET 111A is one terminal of a resistor $R_{116A}$, the other terminal of which is connected to one terminal of a constant voltage source 114A. The other terminal of the voltage source 114A is connected to the drain terminal of the FET 111A. Similarly, one terminal of a resistor $R_{116B}$ is connected to the gate terminal of the FET 111B. The other terminal of the resistor $R_{116B}$ is connected to one terminal of a constant voltage source 114B, the other terminal of which is connected to the drain terminal of the FET 111B. As further seen in FIG. 11B, the source terminals of the FETs 111A and 111B are connected to a common connection point connected to the output terminal which is adapted to be connected to the output load (not shown) of the amplifier. The resistors $R_{116A}$ and $R_{116B}$ are selected to have sufficiently high resistance values to not unduly load the gate circuits of the respective FETs 111A and 111B. With appropriate selection of the constant voltage sources 114A and 114B, the active amplifying devices in the amplifier circuit of FIG. 11B will achieve true Class A operation over the full range of normal input drive signals to the amplifier.

Accordingly, it is seen that the present invention is readily applicable to amplifier circuits using bipolar transistors, FET transistors, vacuum tubes, and various combinations of the foregoing active amplifying devices. It is further seen that the present invention provides an improved high fidelity audio amplifier which achieves true Class A operation over the full range of normal input signals to be amplified.

It is understood that the present invention is not limited to "power amplifiers", per se, but has equal applicability to all types of units in which amplification of an audio, RF, or another alternating current signal is desired. Non-limiting examples of the latter would be "integrated amplifiers" which combine a preamplifier and a power amplifier on the same chassis and "receivers" or "tuner-amplifiers", which combine a preamplifier, a power amplifier and a FM and/or AM tuner on the same chassis. Also, although the above disclosure has been directed only to single channel (mono) devices, it is understood that it is equally adaptable to plural channel applications such as stereo, quadraphonic, etc.

It will, of course, be understood that various changes in the details and arrangements of the circuit elements as described herein and illustrated in the drawings to explain the nature of the invention may be made by those skilled in the art, without departing from the principles or the scope of the present invention as expressed in the appended claims.

What is claimed is:

1. A high fidelity audio amplifier comprising:
input means to the amplifier adapted to receive an input signal to be amplified;
a pair of cooperating active amplifying devices having their respective control inputs operatively connected to said input means and connected to drive a common output in response to an input signal in a mode wherein one active amplifying device is driven more conductive in response to changes of input signal from a zero level while the other active amplifying device is driven less conductive, and vice versa;
bias means for maintaining both of said active amplifying devices in a conductive state when no input signal is provided to the amplifier;
circuit means for providing a current to each of said active amplifying devices;
first and second diode means respectively associated with said active amplifying devices for controlling the current to said active amplifying devices for maintaining said active amplifying devices in a conductive state for input signal values which, when combined with the bias from said bias means would render one or the other of said active amplifying devices nonconductive without said circuit means; and
output means operatively connected to said active amplifying devices for cooperatively combining the respective output signals from said active amplifying devices to provide an amplified output signal from the amplifier.

2. An amplifier according to claim 1 wherein each of said diodes becomes nonconductive to block the signal path of its respective active amplifying device when the input signal is of a value such that, when combined with the bias from said bias means, would render said respective active amplifying device nonconductive without said circuit means.

3. An amplifier according to claim 1, wherein said first diode is connected in a signal pathway of one active amplifying device and not in the signal pathway of the other active amplifying device and said second diode is connected in a signal pathway of said other active amplifying device and not in the signal pathway of said one active amplifying device.

4. An amplifier according to claim 3 wherein said active amplifying devices comprise bipolar transistors; and wherein said circuit means includes two constant current sources, each being connected to a node including one of said diodes.

5. An amplifier according to claim 3 wherein said active amplifying devices comprise vacuum tubes; and wherein said circuit means includes a constant voltage source, a first resistor connected between said constant voltage source and one of said diodes, and a second resistor connected between said constant voltage source and the other of said diodes.

6. An amplifier according to claim 3 wherein said active amplifying devices comprise vacuum tubes; and wherein said circuit means includes two constant current sources, each being connected to a node including one of said diodes.

7. An amplifier according to claim 3 wherein said active amplifying devices comprise FET transistors; and wherein said circuit means includes two constant current sources, each being connected to a node including one of said diodes.

8. An amplifier according to claim 3 wherein said active amplifying devices comprise FET transistors; and wherein said circuit means includes a first constant voltage source and a first resistor connected between said first constant voltage source and one of said diodes; and a second constant voltage source and a second resistor connected between said second constant voltage source and the other of said diodes.

9. An amplifier according to claim 4 wherein said pair of cooperating active amplifying devices are configured in essentially a complementary, symmetric, common-emitter type circuit.

10. An amplifier according to claim 4, wherein said pair of cooperating active amplifying devices are configured in essentially a self-biased, common-collector type circuit.

11. An amplifier according to claim 4 wherein said pair of cooperating active amplifying devices are configured in essentially a quasi-complementary type circuit.

12. An amplifier according to claim 4 wherein said pair of cooperating active amplifying devices are configured in essentially a complementary, symmetric, series type circuit.

13. An amplifier according to claim 4 wherein said pair of cooperating active amplifying devices are configured in essentially a complementary, symmetric, common-collector Darlington type circuit.

14. An amplifier according to claim 4 wherein said pair of cooperating active amplifying devices are configured in essentially a Hitachi Class G type circuit.

15. An amplifier according to claim 5 wherein said pair of active amplifying devices are configured in essentially a push-pull type circuit.

16. An amplifier according to claim 5 wherein said pair of active amplifying devices are configured in essentially a Berning type circuit.

17. An amplifier according to claim 6 wherein said pair of amplifying devices are configured in essentially a push-pull type circuit.

18. An amplifier according to claim 4 wherein said pair of active amplifying devices are configured in essentially a push-pull type circuit.

* * * * *